US008105865B2

(12) United States Patent
Snaith et al.

(10) Patent No.: US 8,105,865 B2
(45) Date of Patent: Jan. 31, 2012

(54) LIQUID CHARGE TRANSPORTING MATERIAL

(75) Inventors: Henry J. Snaith, Sawston (GB); Shaik Mohammad Zakeeruddin, Renens (CH); Michael Graetzel, St-Sulpice (CH)

(73) Assignee: Ecole Polytechnique Fédérale de Lausanne (EPFL), Lausanne (CH)

( * ) Notice: Subject to any disclaimer, the term of this patent is extended or adjusted under 35 U.S.C. 154(b) by 613 days.

(21) Appl. No.: 12/225,322

(22) PCT Filed: Mar. 21, 2007

(86) PCT No.: PCT/IB2007/050992
§ 371 (c)(1),
(2), (4) Date: Sep. 18, 2008

(87) PCT Pub. No.: WO2007/107961
PCT Pub. Date: Sep. 27, 2007

(65) Prior Publication Data
US 2010/0051908 A1    Mar. 4, 2010

(30) Foreign Application Priority Data

Mar. 23, 2006    (EP) .................................... 06111656

(51) Int. Cl.
*H01L 21/00*    (2006.01)
(52) U.S. Cl. ....... 438/82; 438/99; 257/40; 257/E51.012; 252/500; 252/501.1
(58) Field of Classification Search .................... 257/40, 257/E51.012; 438/82, 99; 252/500, 501.1; 544/100
See application file for complete search history.

(56) References Cited

U.S. PATENT DOCUMENTS 5,885,368 A * 3/1999 Lupo et al. .................... 136/263
2006/0029871 A1 * 2/2006 Hu et al. ....................... 430/58.7

FOREIGN PATENT DOCUMENTS

EP          1 160 888       12/2001
WO     WO 2004/025748 A     3/2004

OTHER PUBLICATIONS

Haridas K.R., et al., Synthesis of Low Melting Hole Conductor Systems Based on Triarylamines and Application in Dye Sensitized Solar Cells, Synthetic Metals, Elsevier Sequoia, Lausanne, vol. 121, No. 1-3, Mar. 15, 2001, pp. 1573-1574.
Wang P., et al., Novel Room Temperature Ionic Liquids of Hexaalkyl Substituted Guanidinium Salts for Dye-Sensitized Solar Cells, Applied Physics A: Materials Science and Processing, Springer Verlag, Berlin, vol. 79, 2004, pp. 73-77, XP002290891.
Chittibabu K.G., et al., Ionic liquid based gel electrolyte compositions for dye sensitized solar cells, Electronics on Unconventional Substrates-Electrotextiles and Giant-Area Flexible Circuits, Symposium (Mater.Res. Soc. Symposium Proceedings vol. 736, Mater. Res. Soc Warrendale, PA, USA, 2003, pp. 245-250, XP002438419.
Papageorgiou N., et al., The Performance and Stability of Ambient Temperature Molten Salts for Solar Cell Applications, Journal of the Electrochemical Society, Electrochemical Society, Manchester, New Hampshire US, vol. 143, No. 10, Oct. 1996, pp. 3099-3108, XP002118482.

\* cited by examiner

*Primary Examiner* — Matthew Landau
*Assistant Examiner* — Colleen E Snow
(74) *Attorney, Agent, or Firm* — Clifford W. Browning; Krieg DeVault LLP

(57) ABSTRACT

The present invention relates to optoelectronic and/or electrochemical devices comprising an organic charge transporting material which is liquid at a temperature of $\leq 180°$ C. In particular in dye-sensitised solar cells, quantum efficiency higher than with prior art solid organic hole-transporters is reported. The melting point of a large quantity of organic charge transporting materials may be adjusted to a desired value by selecting suitable substituents. Accordingly, general advantages of the liquid state may be associated with the properties of organic charge transporting materials.

21 Claims, 2 Drawing Sheets

LIQUID CHARGE TRANSPORTING MATERIAL

This application claims the benefits under 35 U.S.C. 119 (a)-(d) or (b), or 365(b) of International Application No. PCT/IB2007/050992 filed 21 Mar. 2007, and European Patent Application No. 06111656.2 filed 23 Mar. 2006.

The present invention relates to an optoelectronic and/or electrochemical device comprising a liquid organic charge transporting material, to a method for preparing a solar cell and to the use of liquid organic charge transporting materials in optoelectronic and/or electrochemical devices.

BACKGROUND ART AND PROBLEMS TO BE SOLVED

While optoelectronic and/or electrochemical devices have been dominated by solid-state junctions, usually made from crystalline or amorphous silicon and profiting from the experience and material availability resulting from the semiconductor industry, there is an increasing awareness of the possible advantages of devices based on mesoscopic inorganic or organic semiconductors commonly referred to as "bulk" junctions because of their interconnected three-dimensional structure. These are formed for example from nanocrystalline inorganic oxides, ionic liquids, and organic hole transporters or charge transporting polymer devices, which offer the prospect of very low cost of fabrication without expensive and energy-intensive high-temperature and high-vacuum processes, compatibility with flexible substrates, and a variety of presentations and appearances to facilitate market entry, both for domestic devices and in architectural or decorative applications.

For the fabrication of many optoelectronic and/or electrochemical devices the use of solid organic semiconductors is not favoured. The sensitized solar cell is an example of such: The hybrid version of this cell comprises a nanostructured oxide film coated with a monolayer of light absorbing sensitizer and infiltrated with an organic semiconductor. It is the latter step which is far from perfect with the current best approach being to spin-coat a concentrated solution of hole-transporter on top of the nanoporous film, allowing the favourable interaction between the hole-transporter and the dye-coated surface to act as a driving force to aid infiltration during solvent evaporation. There are many "voids" in the film of organic semiconductor obtained in this way, and as can be seen from cross-sectional imaging it is difficult to obtain material infiltration through more than a few microns thickness, which is significantly less than the light absorption depth of the composite, typically ten microns.

Objectives of the present invention are the improvement and/or optimisation of the manufacturing of optoelectronic and/or electrochemical devices, of such devices in general if they comprise organic semiconductors, and in particular of the interface between mesoscopic solid semiconductors and organic semiconductors in such devices, especially in sensitised solar cells.

There have been some studies on semi-conducting polymer solutions and electrolytes containing organic semiconductors, in order to improve the contact between semiconductors involving a mesoscopic surface. However, these solutions and electrolytes entail a number of disadvantages, because encapsulation and leakage of high vapour pressure organic solvents present in these electrolytes can hardly be prevented and thus constitute a major challenge for the commercialization of many electrochemical and/or optoelectronic devices and in particular sensitized solar cells. In electrolytes, charge transport is obtained by material diffusion. It is an objective to provide charge transport by electronic motion.

EP 1 160 888 A1 discloses a photoelectric conversion device in which a mixture of two charge transporting materials is used as an electrically conducting agent. At a ratio of 40:60, the mixture has a $T_G$ of $-1.4°$ C. Mixtures of chemically different hole transporting materials are generally disadvantageous, due to the different energy levels of the components. Furthermore, the devices disclosed in EP 1 160 888 A1 have extremely low power conversion efficiencies ($\eta$), which are generally below 0.02%.

Haridas et al., in Synthetic Materials 121 (2001), 1573-1574, disclose polymeric hole conducting materials (HTM) having low melting point as hole conductor system in dye sensitised solar cells. The polymers have a molecular weight of >8000 and low penetration of the HTM into the nanoporous layer was reported. As the authors concede, their concept did not work.

It is thus a further objective of the present invention to capitalise upon the advantages of electrolytes and solutions in optoelectronic and/or electrochemical devices, while avoiding the disadvantages of the same. In particular, it is an objective to have all the typical advantages of organic semiconductors while optimising the contact at the interface of a mesoscopic semiconductor and an organic semiconductor.

It is a further objective to provide an organic semiconductor that is liquid at temperatures of device fabrication ("processing temperature") and optionally solid at device operating temperatures.

SUMMARY OF THE INVENTION

Remarkably, the present inventors demonstrated that liquid organic semiconductors could be used in functional optoelectronic devices. The charge transport properties and mechanisms appear to be similar to the solid-state counterparts. Dye-sensitized solar cells incorporating such a material perform competitively, with impressive power conversion efficiencies. The present invention thus demonstrates that there are many applications for this "new phase" of organic semiconductors. The more general significance of the present, surprising finding is that the use of liquid organic charge transporting materials unexpectedly provides all the advantages of the liquid state in the devices of the invention in combination with the advantages of organic charge transporting materials in general.

Accordingly, in an aspect, the present invention provides an optoelectronic and/or electrochemical device comprising an organic charge transporting material which is liquid at a temperature of $\leq 180°$ C.

In another aspect, the present invention provides an optoelectronic and/or electrochemical device comprising a charge transporting composition, the composition comprising an organic compound of a specific chemical structure, said compound being capable of transporting charges and thus constitutes an organic charge transporting material, characterized in that said composition is free of any other, chemically different organic charge transporting material, and wherein said organic charge transporting material has a molecular weight of $\leq 5000$ and is liquid at a temperature of $\leq 100°$ C.

In another aspect, the present invention provides a method for preparing a solar cell comprising the steps of:
  providing an organic charge transporting composition, said composition comprising a charge transporting material, said material being liquid at a temperature of $\leq 180°$ C.;
  if necessary, liquefying the composition by heating;

if there is any solvent present in said composition, removing the solvent; and, applying the solvent-free, liquid charge transporting composition to the, optionally sensitised, surface of a semiconductor, optionally, following the step of applying the liquid charge transporting material: increasing the viscosity of the liquid hole conducting material by gelling, cross-linking and/or polymerising the liquid charge transporting material; and applying a counter electrode oppositely to said semiconductor.

In yet another aspect, the present invention provides a method for preparing a solar cell comprising the steps of:

providing an organic charge transporting composition, said composition comprising a charge transporting material, said material being liquid at a temperature of $\leq 180°$ C.;

if necessary, liquefying the composition by heating;

optionally, removing any solvent possibly present in said composition; and, applying the liquid charge transporting composition to the optionally sensitised surface of a semiconductor, following the step of applying the liquid charge transporting material: increasing the viscosity of the liquid charge transporting material by gelling, cross-linking and/or polymerising the liquid charge transporting material; and applying a counter electrode onto said charge transporting material so as to provide a solar cell.

In a further aspect, the present invention provides a method of providing a liquid organic charge transporting material, the method comprising the step of chemically modifying an organic charge transporting material by providing residues Ra as defined herein covalently bound to the organic charge transporting material.

In yet further aspect, the present invention provides a method for decreasing the melting point of an organic charge transporting material, the method comprising the step of chemically modifying the organic charge transporting material by providing residues Ra as defined herein covalently bound to the organic charge transporting material.

In a still further aspect the present invention provides the use of organic charge transporting composition comprising a single, chemically pure charge transporting material that is liquid at a temperature of $\leq 100°$ C. and that has a molecular weight $(M_w) \leq 5000$ in an optoelectronic and/or electrochemical device In yet another aspect, the present invention provides a charge transporting composition, said composition comprising an organic charge transporting material defined as an organic compound of a specific chemical structure providing a charge transporting liquid, wherein said organic charge transporting composition is free of any other, chemically different organic charge transporting material, and wherein said organic charge transporting material has a molecular weight of $\leq 5000$ and is liquid at a temperature of $\leq 100°$ C.

BRIEF DESCRIPTION OF THE DRAWINGS

FIG. 1 B shows ultraviolet-visible absorption spectra (measured as 1-Log(transmission)) for 20 µm thick cells of pristine TMEPA (solid line), TMEPA doped with 7% molarity of NOBF$_4$ (dotted line), and a 1.5 µm thick nanoporous TiO$_2$ film coated with a bi-pyridine ruthenium complex sensitizing molecule "K51" (dot-dashed line).

FIG. 3 B shows incident-photon-to-electron photovoltaic action spectra for a similar device to that measured in FIG. 3A.

DETAILED DESCRIPTION OF THE PREFERRED EMBODIMENTS

Figure 1:
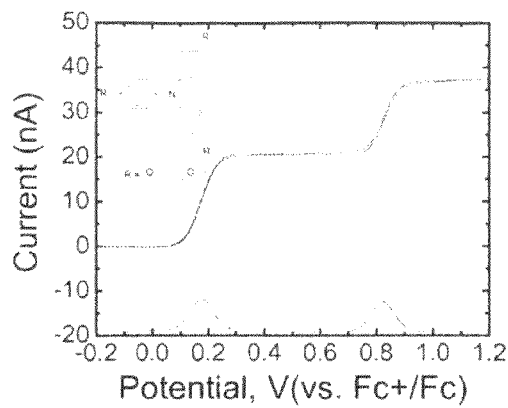
FIG. 1 A shows steady-state (upper curve) and differential pulse (lower curve) voltammograms of tris(p-methoxyethoxyphenyl)amine (TMEPA) indicating the formation of radical cation and dication.
Figure 1:
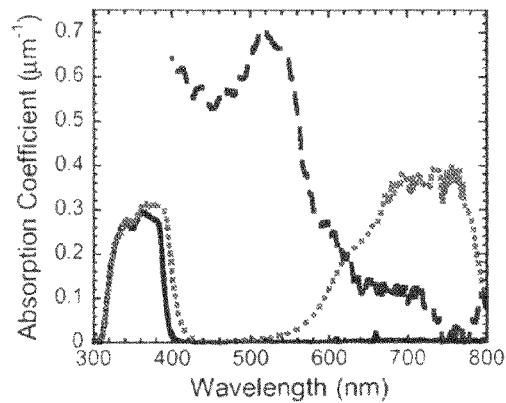

The present invention relates to optoelectronic and/or electrochemical devices comprising an organic charge transporting composition comprising a charge transporting material. The term "comprise" or "comprising", for the purpose of the present invention is intended to mean "including amongst other". It is not intended to mean, "consisting only of".

"Charge transport", as used, for example, in the expression "charge transporting material" refers to transport of electrons and/or holes. It thus means that an electron or hole can move through the material when in its solid and/or liquid state. Preferably, it refers to transport of holes. Preferably it does not refer to transport of ionic molecules.

A "material" for the purpose of the present invention, is given quantity of chemically identical compounds, preferably organic compounds. In other words, a material is a pure chemical compound. Therefore, the charge transporting material in the device of the present invention is defined by the chemical structure of an organic compound having the capability of transporting charges. The properties of charge transport of the charge transporting composition stem from the charge transporting material.

It is preferred that the charge transporting composition comprises only one charge transporting material, that is, not a mixture of different compounds having charge transporting properties. Mixtures of charge transporting materials, in particular those including compositions of organic, charge transporting compounds of different chemical structures are disadvantageous, because a different chemical structure implies different electrical characteristics and properties, hindering charge transport. It is a surprising advantage of the present invention to provide a charge transporting material, which, in chemically pure form, has a sufficiently low glass transition temperature ($T_G$) and/or melting point to be liquid at RT.

Accordingly, the expression "characterized in that said organic charge transporting composition is free of any other, chemically different organic charge transporting material" refers to a charge transporting composition having <30 wt. % and/or <20 wt. %, more preferably <10 wt. % and/or <5 wt. %, and most preferably <3 wt %, <2 wt. % and <1 wt % of a different chemical compound having charge transporting properties, in particular organic compounds having such properties. In other words, the charge transporting composition comprises only one charge transporting material.

Compounds having the same elemental composition but different chemical structure and/or composition are considered as different chemical compounds. Accordingly, structural isomers are considered as chemically different. Stereoisomers may be encompassed as chemically identical for the purpose of the present invention. Preferably, however, cis-trans isomers are considered as chemically different. Some optical isomers may be considered as chemically identical. More particularly, the charge transporting material may be constituted by a composition of enantiomers and/or meso compounds. Preferably, however, the charge transporting material is constituted by a chemically and optically pure charge transporting organic compound. "Pure", for the purpose of the present invention, refers to purity of at least 70 wt. %, 80 wt. %, 90 wt. %, 95 wt. %, 97, wt. %, 98 wt. % and most preferably 99 wt. %. The charge transporting material preferably has a molecular weight of $\leq 5000$, preferably $\leq 4000$, more preferably $\leq 3000$, even more preferably $\leq 1500$ and/or $\leq 1000$, and most preferably $\leq 600$. In case the charge transporting material is polymerised and/or cross-linked as detailed further below, these molecular weights apply to the monomers.

The organic charge transporting material used in the device of the invention is liquid at a temperature of $\leq 180°$ C. Viscosities were measured with a Brookfield DV-II+ viscometer on 0.50 mL of sample. For the purpose of the present invention liquid is defined as being a material with a viscosity of less than 15000 cPs (centipoises).

According to a preferred embodiment of the invention, the organic charge transporting material is liquid at a temperature of $\leq 150°$ C. Preferably it is liquid at $100°$ C. More preferably it is liquid at $\leq 80°$ C., even more preferably at $\leq 60°$ C., $\leq 50°$ C., $\leq 30°$ C., and most preferably at room temperatures ($25°$ C.) or even below RT, for example $\leq 10°$ C., $\leq 0°$ C.

Preferably, the liquid organic charge transporting material is not a liquid crystal. Preferably, it is present in an amorphous form, for example in the form of an amorphous liquid.

If it is present at a viscosity above 15000 cPs, that is, in its solid form, it is preferably present in the form of an amorphous solid.

According to a preferred embodiment, the organic charge transporting material may be liquid at processing (=device manufacturing) and solid at operating temperatures. For many optoelectronic and/or electrochemical devices, such as solar cells, for example, operating temperatures are in the range of $-10$ to $80°$ C., preferably 0-$60°$ C. Processing temperatures, may be set above these temperatures, and generally in the range of 60-$250°$ C. and preferably in the range of 80-$150°$ C.

The liquid and solid characteristics at processing and operating conditions, respectively, may be achieved in alternative ways. According to one embodiment, the organic charge transporting material has a melting point lying between processing and operating temperatures. Accordingly, the melting point may be in the range of 180-$60°$ C., for example at the concrete values indicated above.

Alternatively, the organic charge transporting material may have even lower melting points, preferably $\leq 25°$ C. If solidity at operating temperatures is desired, this may be achieved by gelling, cross-linking and/or polymerising individual compounds and/or moieties of the charge transporting material. Cross-linking and/or polymerisation are preferably achieved through suitable residues (Rp) present on the charge-transporting compound. Suitable cross-linking agents or polymerisation starting materials may also be added to the organic charge transporting material during device fabrication, followed by cross-linking and/or polymerisation in situ, that is, in the device already comprising the organic charge transporting material. Gelation may be obtained by adding a gelator to the charge transporting composition. Gelators may be selected from polymers, inorganic silica nanoparticles and low molecular weight organic gelators. The low molecular weight organic gelators have the advantage, due to the thermoreversibility, that above the sol-gel transition temperature, the nanopores can be efficiently filled with a low viscous liquid and upon cooling a mechanically stable quasi-solid electrolyte is obtained. Accordingly, the step of increasing the viscosity of the charge transporting composition may be realized by decreasing the temperature of the charge transporting composition to below the gelling point, for example to room temperature ($25°$ C.).

According to an embodiment of the present invention, the charge transporting material is liquid as defined above at processing and at operating temperatures. Accordingly, it preferably has a melting point $\leq 60°$ C. as indicated above.

According to a preferred embodiment, the liquid charge transporting material charge-neutral, that is, non-charged. Preferably it is not present in the form of a salt. Accordingly, it does not comprise oppositely charged components such as anions combined with cations. This property preferably refers to the processing conditions. During operation, when charges are transported, charged specimen of the charge transporting material are, of course, formed. The liquid charge transporter is, however, preferably doped to increase charge density. In so doing, charge mobility and/or the conductivity may advantageously be increased in the doped liquid charge transporting material.

One principle of the present invention resides in the fact that solid organic materials known to have charge transporting properties may be chemically modified to transform them to the liquid state.

Accordingly, in a preferred embodiment, the organic charge transporting material comprised in the device of the invention is selected from liquid derivatives of phenylenevinylene, fluorine, phenylene, naphtylene, anthracene, pentacene, indenofluorene, phenanthrenyl, perylene, fullerene, thiophene and acrylate.

For example, providing selected residues covalently linked to the charge transporting material obtain the liquid properties. These residues may generally be selected from residues Ra further described below.

According to a preferred embodiment, the optoelectronic and/or electrochemical device of the invention comprises an organic charge transporting material comprising a structure according to any of formula (I), (II), (III), (IV) and/or (V) below,

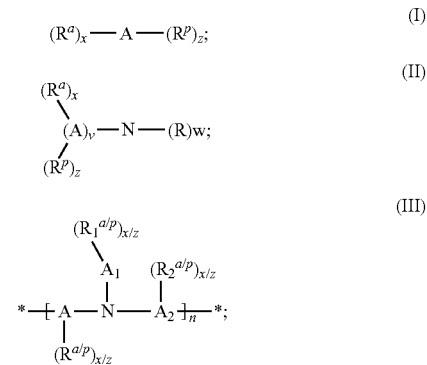

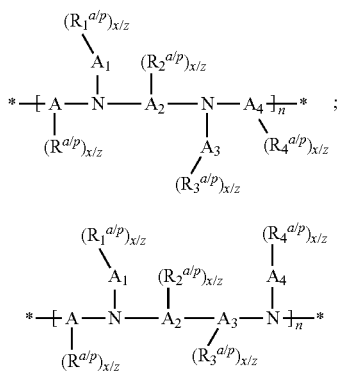

(IV)

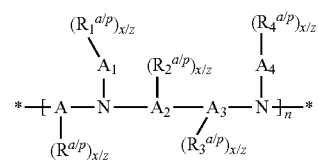

(V)

in which N, if present, is a nitrogen atom;

n, if applicable, is in the range of 1-20;

A is a mono-, or polycyclic system comprising at least one pair of a conjugated double bond (—C=C—C=C—), the cyclic system optionally comprising one or several heteroatoms, and optionally being substituted, whereby in a compound comprising several structures A, each A may be selected independently from another A present in the same structure (II-V);

each of $A_1$-$A_4$, if present, is an A independently selected from the A as defined above;

v in (II) recites the number of cyclic systems A linked by a single bond to the nitrogen atom and is 1, 2 or 3;

(R)w is an optional residue selected from a hydrocarbon residue comprising from 1 to 30 carbon atoms, optionally substituted and optionally comprising 1 or several heteroatoms, with w being 0, 1 or 2 provided that v+w does not exceed 3, and, if w=2, the respective $Rw_1$ or $Rw_2$ being the same or different;

Ra represents a residue capable, optionally together with other Ra present on the same structure (I-V), of decreasing the melting point of an organic compound and is selected from a linear, branched or cyclic alkyl or a residue comprising one or several oxygen atoms, wherein the alkyl or the oxygen comprising residue is optionally halogenated;

x is the number of independently selected residues Ra linked to an A and is selected from 0 to a maximum possible number of substituents of a respective A, independently from the number x of other residues Ra linked to another A optionally present;

with the proviso that per structure (I-V) there is at least one Ra being an oxygen-containing residue as defined above; and, if several Ra are present on the same structure (I-V), they are the same or different; and wherein two or more Ra may form an oxygen-containing ring;

Rp represents an optional residue enabling a polymerisation reaction with compounds comprising structure (I-V) used as monomers, and/or a cross-linking between different compounds comprising structures (I-V);

z is the number of residues Rp linked to an A and is 0, 1, and/or 2, independently from the number z of other residues Rp linked to another A optionally present;

Rp may be linked to an N-atom, to an A and/or to a substituent Rp of other structures according (I-V), resulting in repeated, cross-linked and/or polymerised moieties of (I-V);

$(R^{a/p})_{x/z}$ and $(R_{1-4}^{a/p})_{x/z}$, if present, represent independently selected residues Ra and Rp as defined above.

Preferably, the charge transporting material comprises compounds having the structures (I)-(V).

General reference to the several structures, such as in the references "(I-V)", "(VII-XVI)", or "$A_1$-$A_4$", for example, means reference to any one selected amongst (I), (II), (III), (IV), or (V), any one selected amongst (VII), (VIII), (IX), (X), (XI), (XII), (XIII), (XIV), (XV) or (XVI), or any one selected amongst $A_1$, $A_2$, $A_3$ or $A_4$, respectively. In addition, in the charge transporting material of the invention, for example, different compounds of structures (I-V) may be combined and, if desired cross-linked and/or polymerised. Similarly, in any structure (I-V), different structures for A may be selected independently, for example from (VII-XVI).

According to a preferred embodiment, the organic charge transporting material of the device of the invention comprises a structure according to formula (VI):

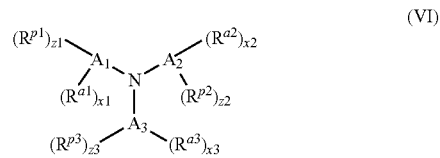

(VI)

in which Ra1, Ra2 and Ra3 and x1, x2 and x3 are defined, independently, like Ra and x, respectively, above;

Rp1, Rp2 and Rp3 and z1, z2 and z3 are defined, independently, like Rp and z, respectively, above. Formula (VI) thus represents a specimen of formula (II) above, in which v is 3, and in which R(w) is absent.

Preferably, A is a mono- or polycyclic, optionally substituted aromatic system, optionally comprising one or several heteroatoms. Preferably, A is mono-, bi- or tricyclic, more preferably mono-, or bicyclic. Preferably, if one or more heteroatoms are present, they are independently selected from O, S, P, and/or N, more preferably from S, P and/or N, most preferably they are N-atoms.

According to a preferred embodiment, A is selected from benzol, naphtaline, indene, fluorene, phenantrene, anthracene, triphenylene, pyrene, pentalene, perylene, indene, azulene, heptalene, biphenylene, indacene, phenalene, acenaphtene, fluoranthene, and heterocyclic compounds such as pyridine, pyrimidine, pyridazine, quinolizidine, quinoline, isoquinoline, quinoxaline, phtalazine, naphthyridine, quinazoline, cinnoline, pteridine, indolizine, indole, isoindole, carbazole, carboline, acridine, phenanthridine, 1,10-phenanthroline, thiophene, thianthrene, oxanthrene, and derivatives thereof, optionally substituted.

According to a preferred embodiment, A is selected from structures of formula (VII-XVI) given below:

(VII)

(VIII)

(IX)

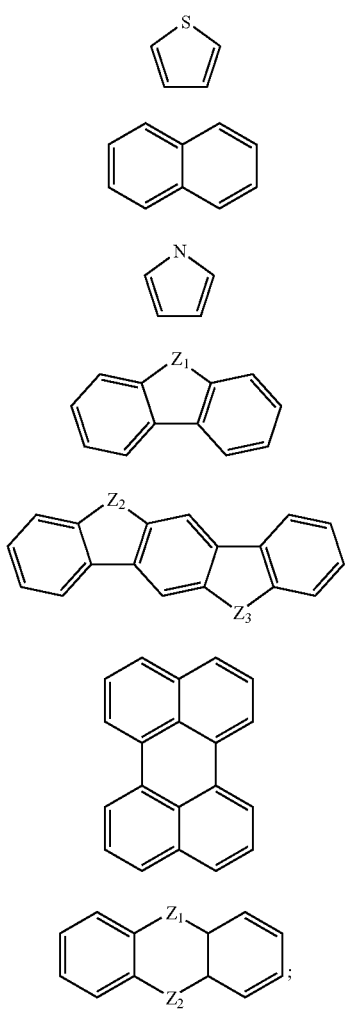

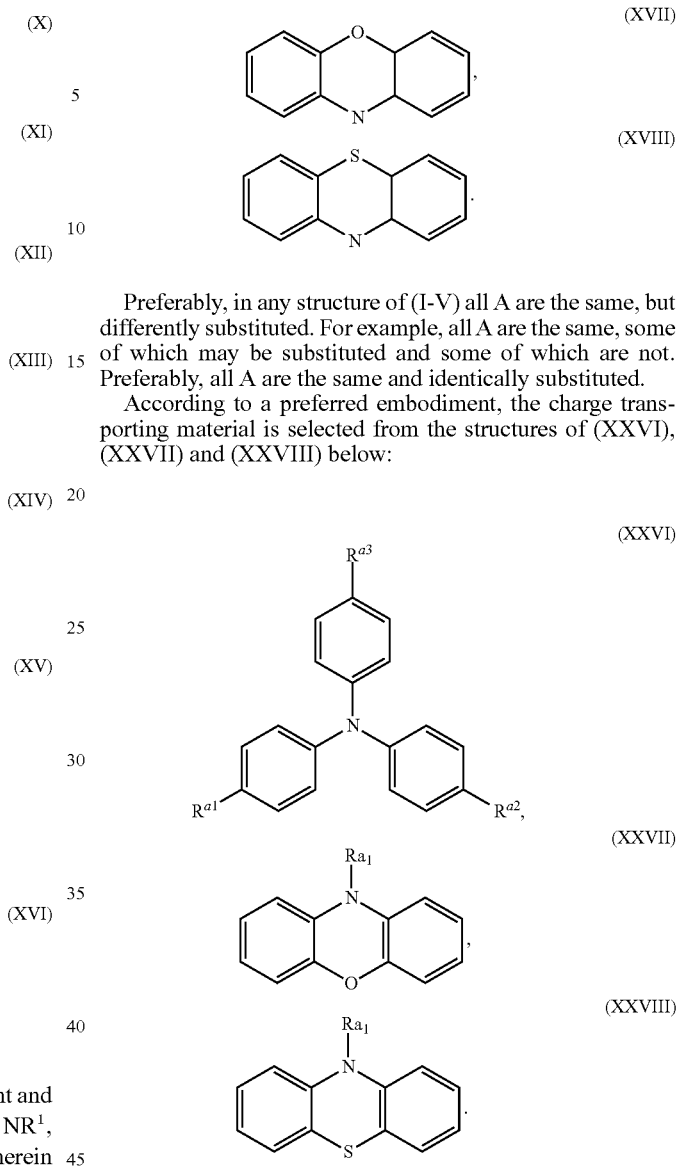

in which each of $Z^1$, $Z^2$ and $Z^3$ is the same or different and is selected from the group consisting of O, S, SO, SO$_2$, NR$^1$, N$^+$(R$^1$)($^{1''}$), C(R$^2$)(R$^3$), Si(R$^{2'}$)(R$^{3'}$) and P(O)(OR$^4$), wherein R$^1$, R$^{1''}$ and R$^{1'''}$ are the same or different and each is selected from the group consisting of hydrogen atoms, alkyl groups, haloalkyl groups, alkoxy groups, alkoxyalkyl groups, aryl groups, aryloxy groups, and aralkyl groups, which are substituted with at least one group of formula —N$^+$(R$^5$)$_3$ wherein each group R$^5$ is the same or different and is selected from the group consisting of hydrogen atoms, alkyl groups and aryl groups, R$^2$, R$^3$, R$^{2'}$ and R$^{3'}$ are the same or different and each is selected from the group consisting of hydrogen atoms, alkyl groups, haloalkyl groups, alkoxy groups, halogen atoms, nitro groups, cyano groups, alkoxyalkyl groups, aryl groups, aryloxy groups and aralkyl groups or R$^2$ and R$^3$ together with the carbon atom to which they are attached represent a carbonyl group, and R$^4$ is selected from the group consisting of hydrogen atoms, alkyl groups, haloalkyl groups, alkoxyalkyl groups, aryl groups, aryloxy groups and aralkyl groups.

Preferred embodiments of, structure (XVI) for A may be selected from structures (XVII) and (XVIII) below:

Preferably, in any structure of (I-V) all A are the same, but differently substituted. For example, all A are the same, some of which may be substituted and some of which are not. Preferably, all A are the same and identically substituted.

According to a preferred embodiment, the charge transporting material is selected from the structures of (XXVI), (XXVII) and (XXVIII) below:

Any A may be substituted by other substituents than Ra and/or Rp. Other substituents may be selected at the choice of the skilled person and no specific requirements are indicated herein with respect to them. Other substituents may thus correspond to (R)w in (II) defined above. Other substituents and R(w) may generally be selected from linear, branched or cyclic hydrocarbon residues comprising from 1 to 30 carbon atoms, optionally substituted and optionally comprising 1 or several heteroatoms, for example. The hydrocarbon may comprise C—C single, double or triple bonds. For example, it comprises conjugated double bonds. For example, optional other residues on A may be substituted with halogens, preferably —F and/or —Cl, with —CN or —NO$_2$, for example.

One or more carbon atoms of other substituents of A may or may not be replaced by any heteroatom and/or group selected from the group of —O—, —C(O)—, —C(O)O—, —S—, —S(O)—, SO$_2$—, —S(O)$_2$O—, —N═, —P═, —NR'—, —PR'—, —P(O)(OR')—, —P(O)(OR')O—, —P(O)(NR'R')—, —P(O)(NR'R')O—, P(O)(NR'R')NR'—, —S(O)NR'—, and —S(O)$_2$NR', with R' being H, a C1-C6 alkyl, optionally partially halogenated.

According to a preferred embodiment, any A may optionally be substituted with one or several substituents independently selected from nitro, cyano, amino groups, and/or substituents selected from alkyl, alkenyl, alkynyl, haloalkyl, alkoxy, and alkoxyalkyl groups, including substituted substituents. Alkyl, alkenyl, alkynyl, haloalkyl, alkoxy and alkoxyalkyl are as defined below.

Preferably, further residues optionally present on A, such as R(w) in (II), for example, are selected from C4-C30 alkenes comprising two or more conjugated double bonds.

Ra is a residue capable of decreasing the melting point of an organic, charge-transporting compound. The reference with respect to the ability to decrease the melting point is the same charge transporting material devoid of the at least one residue Ra. In particular, the function of Ra is to provide a charge transporting material liquid at the temperatures indicated above. The adjustment of the melting point to obtain the desired liquid characteristics in the temperature ranges indicated above may be brought about by a single residue Ra or a combination of identical or different residues Ra, present in any of the structures (I)-(V).

According to the inventors, at least one linear, branched or cyclic residue containing one or several oxygen atoms is preferred for obtaining the liquid characteristics. Other residues, for example alkyls as defined below, may assist in the adjustment of the melting point and/or liquid characteristics.

Ra may be halogenated and/or perhalogenated in that one, several or all H of the residue Ra may be replaced with halogens. Preferably, the halogen is Fluorine.

If Ra is oxygen containing compound, it is preferably a linear, branched, or cyclic saturated C1-C30 hydrocarbon comprising 1-15 oxygen atoms, with the proviso that the number of oxygen atoms does preferably not exceed the number of carbons. Preferably, Ra comprises at least 1.1 to 2 as much carbon as oxygen atoms. Preferably, Ra is a C2-C20, saturated hydrocarbon comprising 2-10 oxygen atoms, more preferably a C3-C10 saturated hydrocarbon comprising 3-6 oxygen atoms.

Preferably, Ra is linear or branched. More preferably Ra is linear.

Preferably, Ra is selected from a C1-C30, preferably C2-C15 and most preferably a C3-C8 alkoxy, alkoxyalkyl, alkoxyalkoxy, alkylalkoxy group as defined below.

Examples of residues Ra may independently be selected from the following structures:

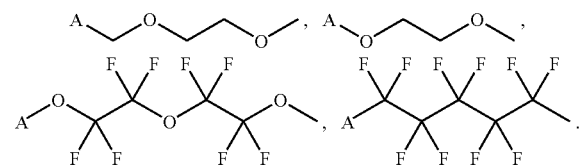

with A indicating any A in formula (I-V) above.

Any Ra present may be linked to a carbon atom or a heteroatom optionally present in A. If Ra is linked to a heteroatom, it is preferably linked to a N-atom. Preferably, however, any Ra is linked to a carbon atom. Within the same structure (I-V), any Ra may be linked to a C or a heteroatom independently of another Ra present on the same A or in the same structure.

Preferably, every structure A, such as A, $A_1, A_2, A_3$ and $A_4$, if present in formulae (I-V) above comprises at least one residue Ra. For example, in the compound according to structure (I-V), at least one structure A comprises an oxygen containing residues Ra as defined above, whereas one or more other and/or the same A of the same compound comprise an aliphatic residue Ra, for example an alkyl group as defined below, preferably a C2-C20, more preferably C3-C15 alkyl, preferably linear.

The following definitions of residues are given with respect to all reference, in the present specification, to the respective residue, in addition to preferred definitions optionally given elsewhere.

An alkoxyalkoxy group above is an alkoxy group as defined below, which is substituted with one or several alkoxy groups as defined below, whereby any substituting alkoxy groups may be substituted with one or more alkoxy groups, provided that the total number of 30 carbons is not exceeded.

An alkoxy group is a linear, branched or cyclic alkoxy group having from 1 to 30, preferably 2 to 20, more preferably 3-10 carbon atoms.

An alkoxyalkyl group is an alkyl group as defined below substituted with an alkoxy group as defined above.

An alkyl group is a linear, branched and/or cyclic having from 1-30, preferably 2-20, more preferably 3-10, most preferably 4-8 carbon atoms. An alkenyl groups is linear or branched C2-C30, preferably C2-C20, more preferably C3-C10 alkenyl group. An alkynyl group is a linear or branched C2-C30, preferably C2-C20, more preferably C3-C10 linear or branched alkynyl group. In the case that the unsaturated residue, alkenyl or alkynyl has only 2 carbons, it is not branched.

A haloalkyl groups above is an alkyl groups as defined above which is substituted with at least one halogen atom.

An alkylalkoxy group is an alkoxy group as defined above substituted with at least one alkyl group as defined above, provided that the total number of 30 carbons is not exceeded.

The aryl group above and the aryl moiety of the aralkyl groups (which have from 1 to 20 carbon atoms in the alkyl moiety) and the aryloxy groups above is an aromatic hydrocarbon group having from 6 to 14 carbon atoms in one or more rings which may optionally be substituted with at least one substituent selected from the group consisting of nitro groups, cyano groups, amino groups, alkyl groups as defined above, haloalkyl groups as defined above, alkoxyalkyl groups as defined above and alkoxy groups as defined above.

The organic charge transporting material may comprise a residue Rp linked to an A. According to a preferred embodiment, Rp is selected from vinyl, allyl, ethinyl, independently from any other Rp optionally present on the A to which it is linked or optionally present on a different A within the structures (I) and/or (II).

The charge transporting material comprised in the device of the invention may be selected from compounds corresponding to the structures of formulae (I-V) as such. In this case, n, if applicable, is 1 and the charge transporting material comprises individual compounds of formulae (I-V), or mixtures comprising two or more different compounds according formulae (I-V).

The compounds of structures (I-V) may also be polymerized and/or cross-linked. This may, for example, be mediated by the residue Rp optionally present on any of the structures (I-V). As a result, oligomers and/or polymers of a given compound selected from (I-V) or mixtures of different compounds selected from structures (I-V) may be obtained to form a charge transporting material. Small n is preferably in the range of 2-10.

Exemplary embodiments of the charge transporting material used or comprised in the device of the invention are the compounds of formulae (XIX), (XX), (XXI) (XXII), (XXIII), (XXV), and (XXVI) below. (XIX), (XXIII) and (XXIV) are embodiments of the more general formulae (II) and (VI) above, whereas compounds (XX) and (XXI) are embodiments of the more general formula (IV) and (V) above, respectively, in which A is benzol and any Rp is absent. Compound (XXII) is an embodiment of the more general formula (I), and in which A comprises 3 N-atoms. Compounds (XIX)-(XXVI) may also be combined with each other to provide the liquid charge transporting material.

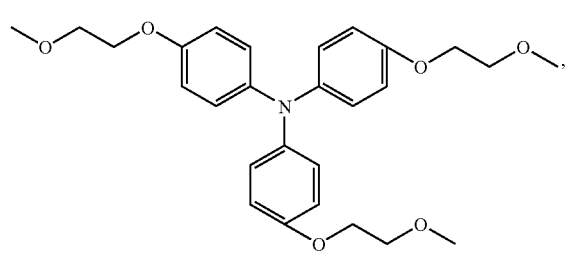
(XIX)

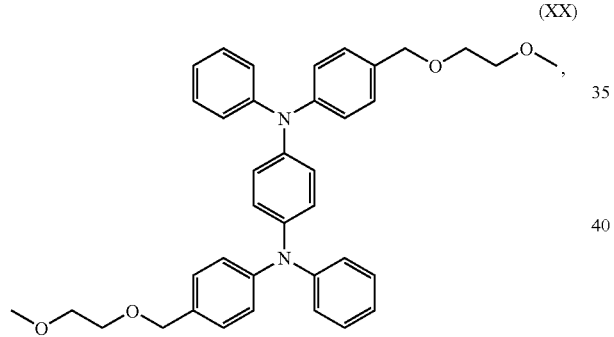
(XX)

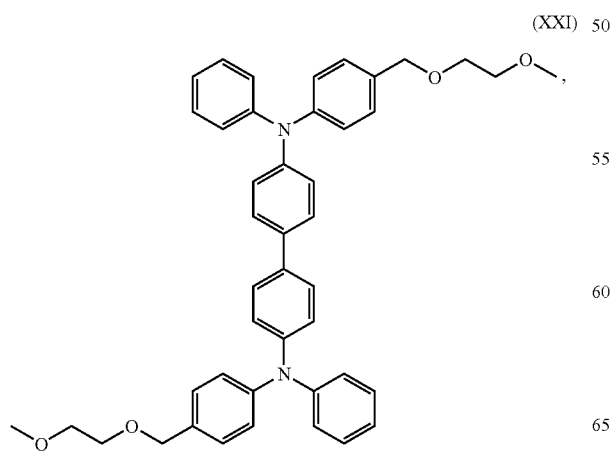
(XXI)

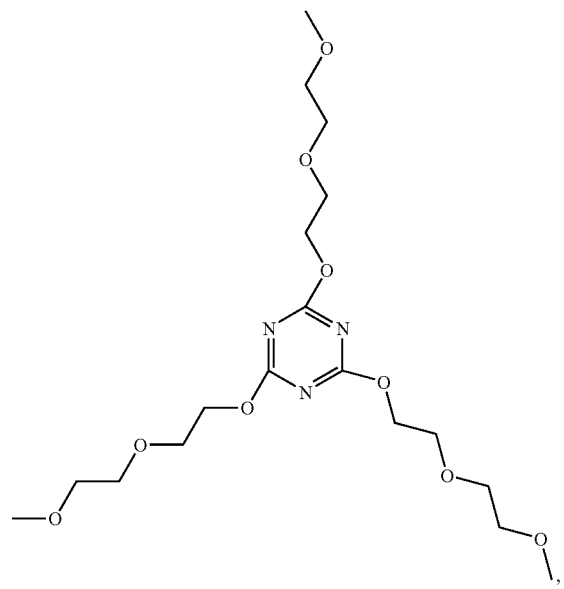
(XXII)

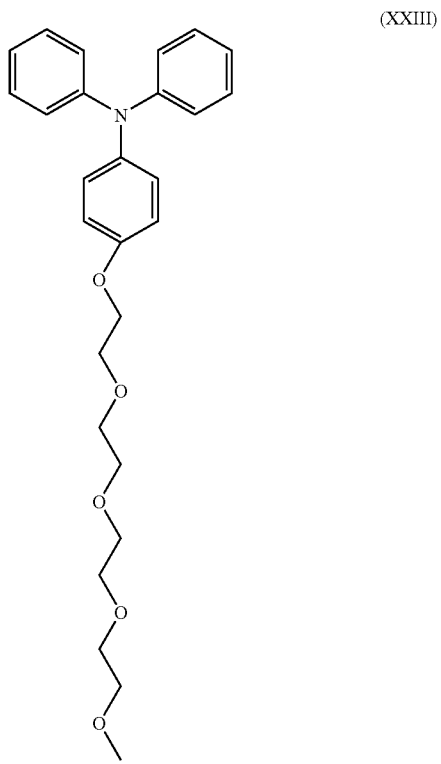
(XXIII)

-continued (XXIV)

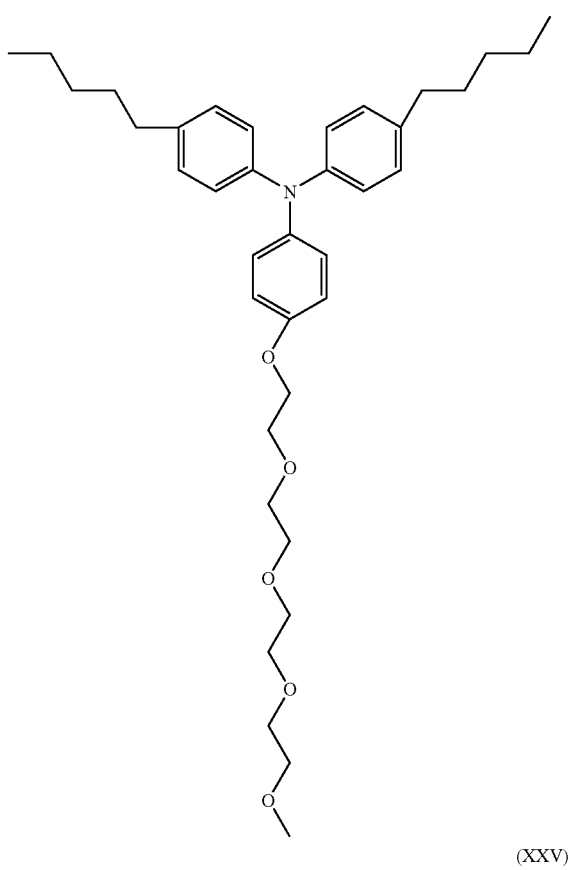

(XXV)

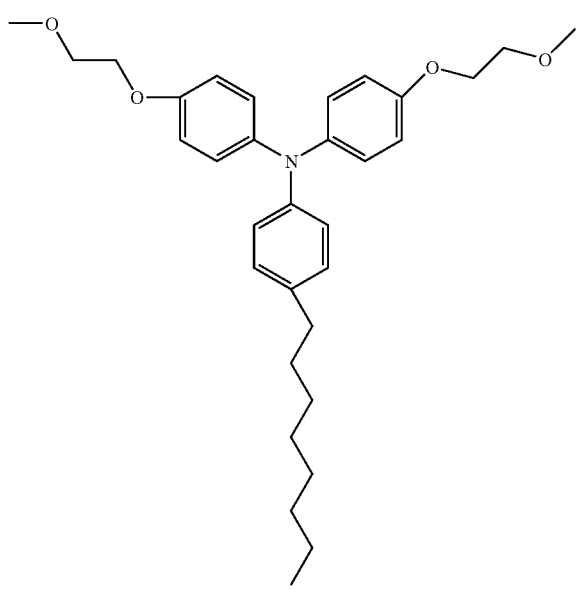

The liquid charge transporting material may be mixed and or supplied with further components. According to an embodiment, the charge transporting composition comprises further components selected from (a) one or more dopants, (b) one or more solvents, (c) one or more other additives such as ionic compounds, and (c) combinations of the aforementioned components. More preferably, the composition consists of the charge transporting material as defined above, one or more dopants, optionally one or more solvents, and, also optionally, one or more other additives such as ionic compounds.

The charge transporting composition preferably comprises 70-100 wt. %, preferably 80-100 wt. % and most preferably 90-100 wt. % of said organic charge transporting material.

Accordingly, the further components are present, in said composition, in amounts of 0-30 wt. %, 0-20 wt. % and 0-10 wt. %. For example, the are present in an amount of 1-20 wt. %.

Preferably, the liquid charge transporting material may be doped in order to improve its electron and/or hole transporting capacities, respectively. Dopants typically used are $NOBF_4$, $N(PhBr)_3SbCl_6$ for example.

The liquid charge transporter may comprise further additives, for example ionic components such as $TBAPF_6$, $NaCF_3SO_3$, $LiCF_3SO_3$, $LiClO_4$ and $Li[(CF_3SO_2)_2N$, as deemed useful.

According to an embodiment, the liquid organic charge transporting material is further combined with at least one at room temperature molten salt and/or at least one further charge transporting material. The optional other charge transporting material may be liquid, as defined above, or solid.

Room temperature molten salts have been previously reported. For example, the molten salts disclosed in EP 1180774A2 starting on page 22, line 10 and ending on page 29, line 16, are expressly incorporated herein by reference. They may be added at 0-49%, preferably 1-20 vol. % by volume of the total charge transporting material. Preferably, they are present at <10%, more preferably <5%, and most preferably <1 vol. %.

It is an important and unexpected advantage of the present invention that the amount of organic solvent can be reduced or even totally omitted, before the charge transporting composition is applied to the device of the invention. In sensitised solar cells, encapsulation, evaporation and leakage of organic solvents provide major problems and making commercial exploitation of these devices not yet feasible. Therefore, a number of efforts have been undertaken to replace the volatile organic solvent.

Although many advantages of the present invention reside in the fact that solvents may generally be dispensed with in device fabrication for avoiding steps of their removal and other disadvantages, for example, the present invention does not principally exclude their utilisation. Solvents may be present for other purposes than "liquefying" the organic charge transporting material, such as for dissolving additives or the like, for example. It may also be envisaged that solvents are used for other purposes.

Accordingly, the organic charge transporting material may optionally be admixed with or dissolved in an organic solvent. Preferably, the liquid charge transporting material present in the device of the present invention is admixed with less than 50 vol. % of an organic solvent. Preferably, the electrolyte comprises less than 40%, more preferably less than 30%, still more preferably less than 20% and even less than 10%. Percentages are indicated on the basis of volume at room temperature (RT=25° C.) with 100% referring to the total of liquid charge transporting material and solvent.

Organic solvents, if present in preferably small amounts as indicated above, may be selected from those disclosed in the literature, for example in EP 0 986 079 A2, page 8, lines 34-49 and again on page 9, lines 1-33. Solvents are also disclosed in EP 1 180 774A2, page 29, lines 31-40. Preferred solvents, however, are those disclosed in EP 1 507 307 A1, page 5, lines 53-58, and page 6, lines 1-16. Preferably, the solvent is a alkoxyalkanenitrile solvent. Accordingly, the alkoxy group is a C1-C8, preferably C1-C4 alkoxy group and the alkane is a C1-C10 alkane, preferably a C2-C6 alkane. Preferably, the solvent, if present, is a C1-C4 alkoxy propionitrile, for example 3-methoxyproprionitrile.

According to a preferred embodiment, the organic charge transporting material is substantially free of a solvent. Substantially free, for the purpose of the present invention means that the charge transporting material comprises ≦5 vol. % and most preferably it is totally free of a solvent. The quantities of solvents indicated herein preferably refer to operating conditions.

The resulting charge transporting composition comprising optional additives, room temperature molten salts, optional further charge transporting materials, for example, may be liquid or solid. However, the resulting charge transporting composition is preferably liquid at processing conditions, but may be solid during operational conditions. The additives may thus be used to tune and/or adjust the melting point of the liquid charge transporting material at the discretion of the skilled person. Preferably, the resulting charge transporting composition has the properties with respect to melting point and/or state of aggregation as defined hereinabove for the liquid charge transporting material as such.

The liquid organic charge transporting material may be used in any optoelectronic and/or electrochemical device employing charge-transporting materials. According to a preferred embodiment, the optoelectronic and/or electrochemical device of the present invention is selected from the group of a light emitting electrochemical cell, a light emitting diode, a field effect transistor and/or a solar cell. Preferably, the device is a photoelectric conversion device, preferably, it is a solar cell, more preferably a sensitized solar cell, for example a dye-sensitised solar cell.

The solar cell of the present invention, when exposed when exposed to simulated sunlight of an intensity of 100 mWcm$^{-2}$, has a power conversion efficiency ($\eta$) of at least 0.5%. Said efficiency (72) may be determined under low light intensity (10 mWcm$^{-2}$), medium light intensity (50 mWcm$^{-2}$) and/or full sunlight intensity (100 mWcm$^{-2}$). Preferably, the solar cell has an efficiency ($\eta$) of at least 0.5%, preferably at least 1%, more preferably at least 1.5%, even more preferably at least 2% and most preferably at least 2.4% at either low, medium or full sunlight intensity. More preferably, the above efficiencies ($\eta$) are obtained at all these intensities. More preferably, the solar cell has an $\eta \geq 2.8$ at low and medium light intensities.

If the device of the present invention is a solar cell, it comprises a semiconductor electrode comprising a semiconductor layer, the optionally cross-linked and/or polymerised organic charge transporting composition described above, and a counter electrode. The charge transporting composition is preferably disposed between said semiconductor electrode and the counter electrode, forming a charge transport layer. According to a preferred embodiment of the invention, the semiconductor is based on material selected from the group of Si, TiO2, SnO2, Fe2O3, WO3, ZnO, Nb2O5, CdS, ZnS, PbS, Bi2S3, CdSe, GaP, InP, GaAs, CdTe, CuInS2, and/or CuInSe2. Preferably, the semiconductor comprises a mesoporous surface, thus increasing the surface optionally covered by a dye and being in contact with the organic charge transporting material. Preferably, the semiconductor is present on a glass support or plastic or metal foil. Preferably, the support is conductive.

More generally, the interface between the semiconductor and the charge transporting material of the device is preferably sensitised, for example by (a) molecular sensitizers, such as dyes, metal organic complexes, organic sensitizers, incorporating a surface attachment group such as carboxilic acid, or phosphonic acid, for example; (b) polymeric sensitizers, such as poly phenylene vinylene, poly thiothene, poly fluorene, poly acetylene, poly perylene, and derivatives thereof; (c) quantum dots, for example PbS or CdSe nanoparticles; (d) a thin layer of a semiconductor, for example Si, CuO, CdTe or PbSe capable of injecting one charge carrier in the semiconductor and the oppositely charged carrier in the charge transport layer; and/or, (e) combinations comprising two or more selected from all of the above.

In a further preferred embodiment, the device is a dye or quantum dot sensitised solar cell. Quantum dot sensitised solar cells are disclosed in U.S. Pat. No. 6,861,722, for example. In dye-sensitized solar cells, a dye is used to absorb the sunlight to convert into the electrical energy. Examples of dyes are disclosed in EP 0 986 079 A2, EP 1 180 774A2, and EP 1 507 307 A1.

The counter electrode is, for example, flourine doped tin oxide or indium doped tin oxide on glass (FTO- or ITO-glass, respectively) coated with Pt or carbon or poly(3,4-ethylenedioxythiophene) (PEDOT).

The present invention provides methods for providing a liquid organic charge transporting material and for decreasing the melting point of an organic charge transporting material comprising the step of chemically modifying an organic charge transporting material by providing residues that are suitable to modify, and preferably decrease, the melting point of an organic charge transporting material. Preferred residues that were shown to have this capacity are residues Ra as described above.

Surprisingly, by selecting the structure and/or the number of a residue of type Ra, it is possible to modify the melting point and/or aggregation state at a given temperature at the discretion of the skilled person. It is remarkable that liquid charge transporting materials, in the absence of solvents, retain their charge transporting capacity. It is shown, in the present invention, that the "liquefied" charge transporting materials are functional in optoelectronic and/or electrochemical devices. The chemical reaction and/or procedures for providing residues modifying the melting point to organic charge transporting materials are available to the skilled person.

Organic charge transporting materials the melting point of which is to be modified can be taken from the literature. They may be selected from compounds of structures (I-V) above, in which Ra may be absent, or if it is present already, the melting point is not yet sufficiently decreased. The step of chemically modifying the organic charge transporting material is then conducted by providing a sufficient number of residues Ra to obtain compounds of structures (I-V) comprising residues Ra as defined above. The melting point of the charge transporting material may thus be adjusted close to a desired temperature.

Accordingly, an organic charge transporting material which is liquid at a temperature ≦180° C. is provided.

In the method of preparing a solar cell, the liquid organic charge transporting material is applied to the, optionally sensitised, surface of a semiconductor of a solar cell. The liquid organic charge transporting material may, for example, be applied like liquid electrolytes, the latter being sometimes utilized in these devices.

According to the method of the present invention, the organic charge transporting material is applied in the form of a liquid to the surface of a semiconductor of a solar cell. A number of alternative methods for applying the liquid may be used.

For example, the solar cell may already comprise a semiconductor applied to an anode and a cathode, the solar cell thus including a void to be filled by the charge transporting material. The liquid charge transporting material may then be added through a hole into the void, until the void is filled by the charge transporting material. For example, the liquid material may be pressed with pumps into the void, or it may be sucked into the void by creating a depression or vacuum in the void.

Alternatively, the liquid charge transporting material may be poured onto the semiconductor applied to an anode, followed by addition of a cathode onto the liquid material and sealing any gap between the semiconductor and the cathode. The sealing prevents leaking from the solar cell thus obtained.

Optionally, in the method of preparing a solar cell, the viscosity and/or the melting point may be increased, after applying the liquid charge transporting material. For example, the melting point may be increased to a value above 180° C., preferably above 100° C., should the original charge transporting material be liquid at these temperatures. Once the liquid charge transporting material being applied, an optimised coverage of the interface between the sensitized surface of an electron conducting material of a solar cell is already established, and it would be advantageous to restore the solid characteristics of the organic charge transporting material. This may be preferably be achieved by in situ polymerisation and/or crosslinking of individual compounds of the organic charge transporting material. To this end, the liquid organic charge transporting material preferably comprises residues Rp, which allow cross-linking and/or polymerisation. Other ways of increasing viscosity are available to the skilled person, such as addition of polymers to the organic charge transporting material, to achieve gelification.

The present invention may further be understood by consideration of the following examples, which are not intended to limit its general scope.

EXAMPLES

Example 1

Synthesis of tris(p-methoxyethoxyphenyl)amine (TMEPA)

In a 250 ml round-bottomed flask equipped with reflux condenser and magnetic stirrer, sodium (1.38 g) freshly cut into small pieces was added to dry 2-methoxyethanol. After complete dissolution, sym-collidine (125 ml) dried over molecular sieve, copper (I) iodide (1.9 g) and the tris-bromophenylamine (4.96 g) were added, and the mixture was heated to reflux for 18 hours with vigorous stirring. It was then filtered while still hot, and the solvents were removed on a rotavapor. From this viscous liquid was extracted by diethylether. The extract was washed by 1 M aqueous HCl and 3,4 times with water. The organic phase was evaporated to get a viscous liquid of TMEPA as a crude compound. It was further purified by passing through the column.

TMEPA has a glass transition temperature of less than −10° C. as determined by dynamic scanning calorimetry.

Example 2

Charge Transporting Properties and Absorption Spectrum of TMEPA

A cyclic voltammetry was conducted based on TMEPA in a 0.1 M tetra-n-butylammonium hexafluorophosphate (TBAPF$_6$) in acetonitrile solution. The result is depicted in FIG. 1A.

The oxidization peak is observed to be at approximately 0.17 V versus Fc+/Fc which corresponds to a highest occupied molecular orbital (HOMO) energy level of 5.34 eV below vacuum. This is suitably low to enable hole transfer from the oxidized dye molecule (HOMO ∼−5.7 eV) in order to facilitate charge generation and separation in the photovoltaic process.

FIG. 1B shows the absorption spectrum of TMEPA, both pristine and doped with 7% Molar concentration of nitrosonium tetrafluoroborate (NOBF$_4$). The absorption onset of the pristine material occurs at approximately 400 nm. If we assume an exciton binding energy of 0.4 eV[14] then the resulting energy gap and lowest unoccupied molecular orbital (LUMO) energy level are 3.5 eV and −1.8 eV with respect to vacuum, respectively. It is clear from the induced oxidization absorption peak in the spectrum that NOBF$_4$ successfully dopes the liquid hole-transporter. Fortunately, the absorption peak of the oxidized species is shifted far enough to the red that this material will not significantly reduce the absorption of light in the dye molecules, the absorption of which is also shown in FIG. 1B.

Example 3

Conductivity of Pure and NOBF$_4$-Doped TMEPA

Impedance measurements were conducted according to Wang Q et al., J. Phys. Chem. B, 2005, 109, 14945, to establish the conductivity of doped and pristine TMEPA. Sandwich cells comprising of two fluorine-doped SnO$_2$ (FTO) electrodes separated by a 20 µm Surlyn spacer were filed with the liquid hole-transporter.

Figure 2:
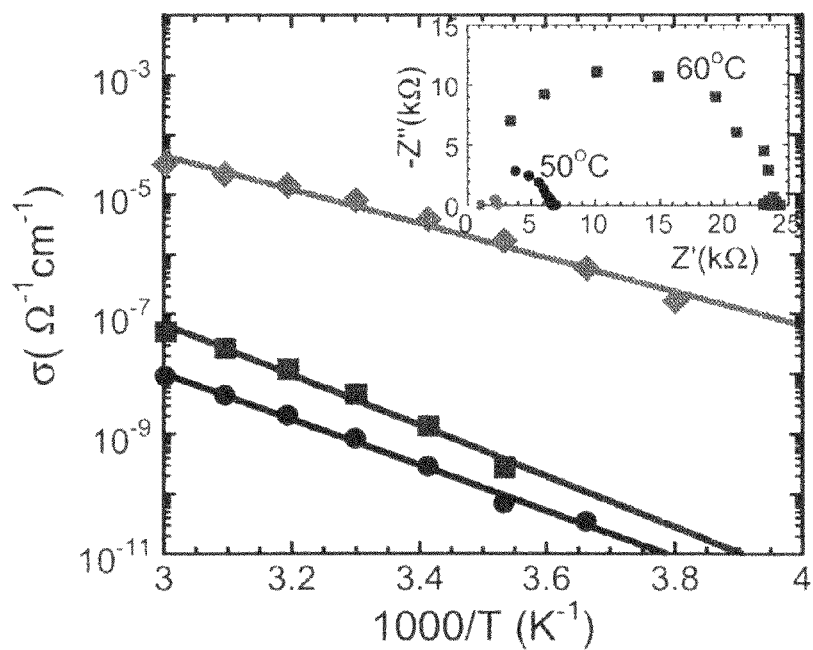
FIG. 2 is an Arrhenius plot of conductivity versus temperature for the pure TMEPA (circles), with the addition of 1% Molar concentration of NOBF$_4$ as the electrochemical dopant (squares) and with the addition of 7% Molar concentration of NOBF$_4$ (diamonds).

The results are shown in FIG. 2. The inset to FIG. 2 shows the Nyquist plots for TMEPA doped with 7% NOBF$_4$ at different temperatures. The activation energy for charge transport, as derived from the Arrhenius plots, reduces considerably when over 1% electrochemical dopant is added to the material (from 0.75 eV for the pure material to 0.56 eV when 7% dopant is added). This is strong evidence that charge "hopping" and not material migration is the primary mechanism for charge transport. The activation energy with 7% dopant is comparable to that observed for poly(p-phenylene vinylene) suggesting that the charge transport mechanism in this new class of materials is similar to that for conventional solid organic semiconductors. The slightly larger activation energy at 1% doping as compared to the pure material is likely to be due to carrier trapping by dopant anions. This is again consistent with conventional solid organic semiconductors where doping levels in excess of 1% are often needed to achieve increased conductivity.

Example 4

Fabrication of Solar Cells

A double-layer, mesoporous TiO$_2$ electrode was prepared following the optimised procedure disclosed in Kavan, L. & Gratzel, M. Highly efficient semiconducting TiO$_2$ photoelectrodes prepared by aerosol pyrolysis. Electrochim. Acta 40, 643-652 (1995), (Chapter 3) in order to obtain a photoanode. Accordingly, A 2.5 µm thick mesoporous layer of TiO$_2$ nanoparticles (∼20 nm in diameter) was screen printed upon a fluorene doped SnO$_2$ glass sheet pre-coated with a compact TiO$_2$ interlayer (100 nm thickness) by spray pyrolysis.

The dye used for sensitization is termed K51 and its synthesis is described in Snaith, H. J., Zakeeruddin, S. M., Schmidt-Mende, L., Klein, C. & Gratzel, M. Ion-coordinating sensitizer in solid-state hybrid solar cells. Angewandte Chemie-International Edition 44, 6413-6417 (2005).

The dye K51 is adsorbed on the TiO$_2$ layered electrode following the procedure described for the N719: Ru dye disclosed in Ito, S. et al. Control of dark current in photoelectrochemical (TiO2/1-1-3(−)) and dye-sensitized solar cells. Chemical Communications, 4351-4353 (2005).

Instead of Pt, as reported by Ito et al above, however, a 50 μm Au coating evaporated on an FTO glass slide was applied in the present example.

For use in the solar cells the TMEPA was doped with 0.07 M N(PhBr)$_3$SbCl$_6$ as electrochemical dopant, had the addition of 12 μl of tertbutylpyridine to every 100 μl of TMEPA and 0.1 M of Li[(CF$_3$SO$_2$)$_2$N]. These additives were predissolved in acetonitrile before incorporation with the liquid hole-transporter. The prepared "solutions" were pumped down to 10$^{-1}$ mbar overnight, in order to remove all residual solvent before device fabrication.

The "empty" cells were subsequently filled with the TMEPA through a small hole in the cathode; 20 μl of material was dispensed on top of the hole. The cell was then pumped under vacuum, which drew air bubbles out of the sealed device through the liquid hole-transporter. Removal of the vacuum resulted in the TMEPA being forced into the cell by the external pressure. This procedure is disclosed in more detail in Ito, S. et al. Control of dark current in photoelectrochemical (TiO2/1-1-3(−)) and dye-sensitized solar cells. Chemical Communications, 4351-4353 (2005).

Example 5

Characteristics of the Solar Cells

The photovoltaic characterization of the solar cells of Example 4 was carried out as reported in U. Bach et al. Nature 1998, vol. 395, 583-585.

Accordingly, current voltage characteristics, typical device parameters (short-circuit photocurrent density ($J_{sc}$), the fill factor (FF), the open-circuit photovoltage ($V_{oc}$), and the photovoltaic conversion efficiency (η)) and incident photon to current conversion efficiency (IPCE) were determined as detailed in U. Bach et al. Nature 1998, vol. 395, 583-585. Photocurrent-voltage characteristics were measured with a Keithley 2400 SourceMeter and a 400WXe lamp. A Schott KG3 filter was used in order to approach the spectral distribution of the lamp to air mass 1.5 G. The light intensity was regulated to the desired energy output by using a silicon solar cell, calibrated at the ISE-Fraunhofer Institut in Freiburg, Germany. Efficiencies were corrected for the spectral mismatch. The fill factor (FF) is defined as FF ¼ Voptlopt=IscVoc, where Vopt and Iopt are respectively current and voltage for maximum power output, and Isc and Uoc are the short-circuit current, and open-circuit voltage, respectively.

FIG. 3A shows the current voltage characteristics for a cell in the dark and under simulated AM 1.5 solar conditions at 10, 53 and 100 mWcm$^{-2}$. We find that the device operates considerably well with an impressive rectification ratio in the dark of over 10$^3$ at +/−1.0 V, demonstrating good diode characteristics.

The device performance parameters are shown in Table 1.

TABLE 1

Device performance parameters at different illumination intensities

|  | 10% | 53% | 100% |
|---|---|---|---|
| $J_{SC}$ (mAcm$^{-2}$) | 0.65 | 3.0 | 4.6 |
| $V_{OC}$ (mV) | 650 | 730 | 770 |
| FF (%) | 73 | 71 | 70 |
| η (%) | 2.9 | 2.8 | 2.4 |

The power conversion efficiency is close to 3% at 10 mWcm$^{-2}$ and 2.4% at 100 mWcm$^{-2}$ incident illumination intensity. With the exception of one material 2,2',7,7'-tetrakis (N,N-di-methoxyphenyamine)-9,9'-spirobifluorene (Spiro-MeOTAD), this is the highest reported power conversion efficiency for a dye sensitized solar cell employing an organic semiconductor as a charge transfer and transport component. Moreover, the first report of Spiro-MeOTAD used in the mesoporous dye-sensitized solar cell presented a device exhibiting an efficiency of 0.7% at low light intensity. This has been increased to over 4% with improved knowledge and optimization, and similar improvements are expected to be achieved with this system.

Figure 3:
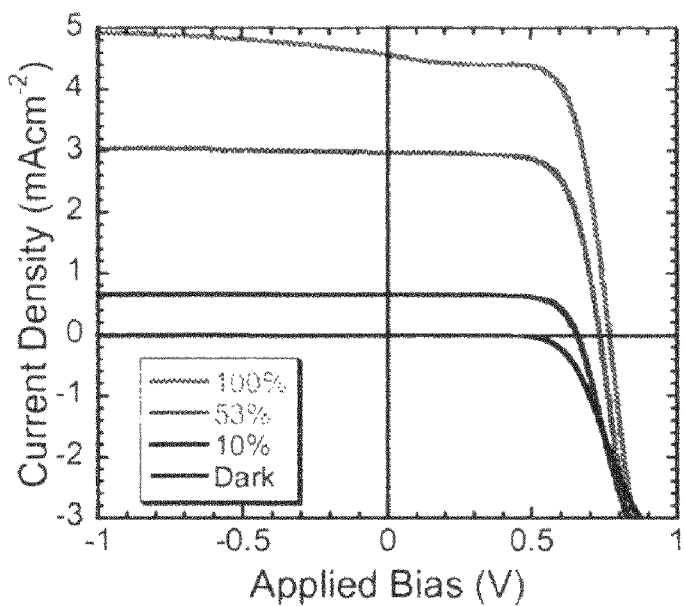
FIG. 3 A shows current-voltage characteristics of a dye-sensitized solar cell incorporating the liquid-hole-transporter TMEPA with 7% NOBF$_4$ dopant, in the dark (lower line), and under AM 1.5 simulated solar illumination at 10 (line at about 0.8 mAcm$^{-2}$), 53 (line at about 3 mAcm$^{-2}$) and 100 mWcm$^{-2}$ (top line).
Figure 3:
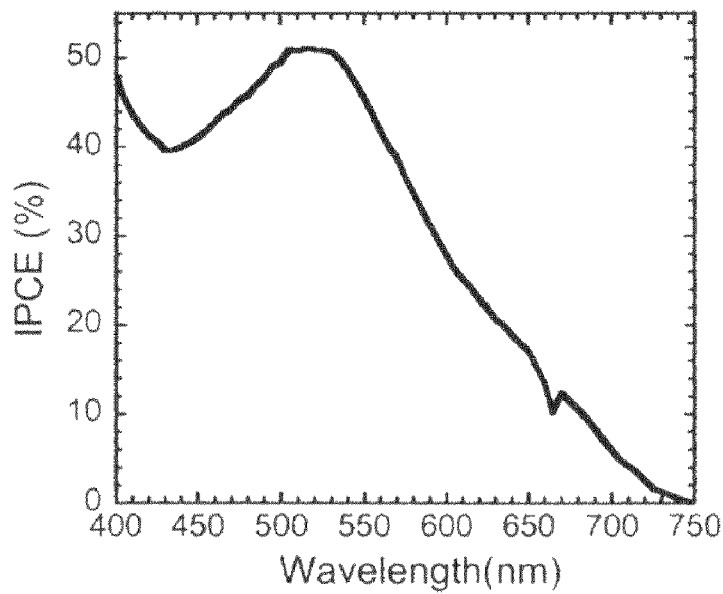

To verify that the operation of the cell is conventional, which is that light absorption takes place in the dye molecules with subsequent charge transfer to the TiO$_2$ and hole-transporter, the incident photon-to-electron collection efficiency (IPCE) photovoltaic action spectra is presented in FIG. 3 B. Firstly, these cells appear to operate conventionally, and secondly incredibly well with a quantum efficiency significantly higher than that obtained using Spiro-MeOTAD and a similar dye. To date this is the highest quantum efficiency reported for any organic hole-transporter used in a dye-sensitized solar cell.

Example 6

Synthesis of
10-2-(2-methoxyethoxy)ethyl-10H-phenoxazine (MEEP) and Fabrication of Solar Cell Butyllithium (1.6 M in hexane, 5 ml) was added dropwise to a stirring solution of 10H-phenoxazine (1.00 g, 5.46 mmol) in THF at −78° C. and continued the stirring for 1 h. To this mixture added 1-bromo-2-(2-methoxyethoxy)ethane (1.5 ml, 11 mmol) dropwise and stirring continued for another 1 h at −78° C. The mixture was allowed to warm to RT and stirred overnight, after which the resultant dark orange solution was quenched with water. The aqueous phase was separated and extracted with dichloromethane. The combined organic phases were dried over magnesium sulfate and evaporated under reduced pressure. The crude mixture was purified by chromatography and Kugelrohr distillation to give the product as a pale yellow oil (1.11 g, 72%). Cyclic voltammetry of MEEP in a 0.1 M tetra-n-butylammonium hexafluorophosphate (TBAPF$_6$) in acetonitrile solution shows a reversible redox couple at 0.26 V vs Fc$^+$/Fc.

Formula (XXIX): MEEP

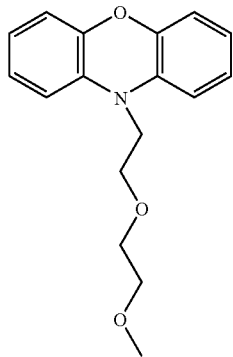

Fabrication of Solar Cells was done as in Example 4 by replacing TEMPA with MEEP as hole transporting material. The photovoltaic characterization of the solar cells was carried out as reported in Example 5. The devices gave light to electricity conversion efficiency of 1.1% under 100 mWcm$^2$ AM 1.5 irradiance light intensity. Under medium light intensity (53 mWcm$^{-2}$), the efficiency of 1.5% obtained.

Example 7

Polymer Gel Hole Transporting Material

An equimolar mixture of MEEP and methylmethacrylate is prepared and bubbled with nitrogen gas to ensure an oxygen-free atmosphere. To this solvent free mixture is further added 2 mol % of benzoyl peroxide (BPO) as an initiator (azobisisobutyronitrile (AIBN) at 1 wt. % could also be used), resulting in a mixture that is used to prepare solar cells as described in Example 4, replacing TEMPA. Radical polymerization is carried out by heating the solar cells to 80° C. for 12 h. The resulting polymer poly(methyl methacrylate) has a good compatibility with MEEP and functional solar cells are obtained.

Example 8

Gelation of Liquid Hole Transport Material with a Low Molecular Weight Gelator

Cyclohexanecarboxylic acid-[4-(3-tetradecyl-ureido)-phenyl]-amide is used as a gelator to gel the liquid hole transport material. Cyclohexanecarboxylic acid-[4-(3-tetradecyl-ureido)-phenyl]-amide (2 wt %) is mixed with MEEP and then heated until no solid was observable. Solar cells were immediately prepared as described in Example 4, replacing TEMPA with the mixture comprising the dissolved low molecular weight gelator. In the following hours, the gelator molecules build up nano-scaled fibrils due to the formation of hydrogen bonds and thereby forms a three-dimensional network in the hole conducting layer of the solar cell. This leads to gelation of the liquid mixture and hinders the liquid to flow. After cooling to room temperature, a uniform motionless gel is formed.

The invention claimed is:

1. An optoelectronic and/or electrochemical device comprising a charge transporting composition, the composition comprising an organic compound of a specific chemical structure providing a charge transporting amorphous liquid, said compound being electronically conductive and thus capable of transporting electrons or holes and thus constitutes an electronically conductive organic charge transporting material, wherein said composition is substantially free of any other, chemically different organic electronically conductive charge transporting material, and wherein said organic charge transporting material has a molecular weight of ≦5000 and is liquid at a temperature of ≦100° C.

2. The device of claim 1, wherein the charge transporting material is liquid at a temperature of ≦60° C.

3. The device of any of claim 1, wherein the charge transporting composition comprises 70-100 wt. % of said organic charge transporting material.

4. The device of any of claim 1, wherein the charge transporting composition comprises further components selected from (a) one or more dopants, (b) one or more solvents, (c) one or more other additives such as ionic compounds, and (c) combinations of the aforementioned components.

5. The device of claim 1, wherein the liquid charge transporting composition is substantially solvent-free and/or wherein the charge transporting material is charge-neutral.

6. The device of claim 1, wherein the molecular weight of said charge transporting material is ≦3000.

7. The device of claim 1, which is selected from the group of a light emitting electrochemical cell, a light emitting diode, a field effect transistor and/or a solar cell.

8. The device of claim 1, comprising:
   a semiconductor electrode comprising a semiconductor layer;
   a counter electrode opposed to the semiconductor electrode; and,
   a charge transporting layer disposed between said semiconductor electrode and the counter electrode, said charge transporting layer being provided by the charge transporting composition.

9. The device of claim 1, which is a solar cell, which, when exposed to simulated sunlight of an intensity of 100 mWcm$^{-2}$, has a power conversion efficiency (η) of at least 0.5%.

10. The device of claim 1, in which the liquid charge transporting material comprises a structure according to any of formula (I), (II), (III), (IV) and/or (V) below,

(I)

(II)

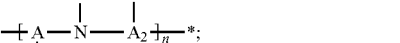
(III)

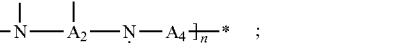
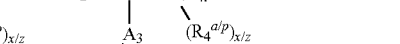
(IV)

-continued

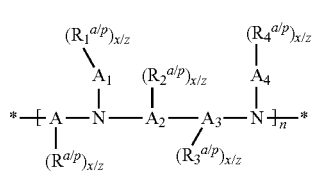  (V)

in which N, if present, is a nitrogen atom;

n, if applicable, is in the range of 1-20;

A is a mono-, or polycyclic system comprising at least one pair of a conjugated double bond (—C=C—C=C—), the cyclic system optionally comprising one or several heteroatoms, and optionally being substituted, whereby in a compound comprising several structures A, each A may be selected independently from another A present in the same structure (I-V);

each of $A_1$-$A_4$, if present, is an A independently selected from the A as defined above;

v in (II) recites the number of cyclic systems A linked by a single bond to the nitrogen atom and is 1, 2 or 3;

(R)w is an optional residue selected from a hydrocarbon residue comprising from 1 to 30 carbon atoms, optionally substituted and optionally comprising 1 or several heteroatoms, with w being 0, 1 or 2 provided that v+w does not exceed 3, and, if w=2, the respective $Rw_1$ or $Rw_2$ being the same or different;

$R^a$ represents a residue capable, optionally together with other $R^a$ present on the same structure (I-V), of decreasing the melting point of an organic compound and is selected from a linear, branched or cyclic alkyl or a residue comprising one or several oxygen atoms, wherein the alkyl and/or the oxygen comprising residue is optionally halogenated;

x is the number of independently selected residues $R^a$ linked to an A and is selected from 0 to a maximum possible number of substituents of a respective A, independently from the number x of other residues $R^a$ linked to another A optionally present;

with the proviso that per structure (I-V) there is at least one $R^a$ being an oxygen containing residue as defined above; and, if several $R^a$ are present on the same structure (I-V), they are the same or different; and wherein two or more $R^a$ may form an oxygen-containing ring;

$R^p$ represents an optional residue enabling a polymerisation reaction with compounds comprising structure (I-V) used as monomers, and/or a cross-linking between different compounds comprising structures (I-V);

z is the number of residues $R^p$ linked to an A and is 0, 1, and/or 2, independently from the number z of other residues $R^p$ linked to another A optionally present;

$R^p$ may be linked to an N-atom, to an A and/or to a substituent $R^p$ of other structures according (I-V), resulting in repeated, cross-linked and/or polymerised moieties of (I-V);

$(R^{a/p})_{x/z}$ and $(R_{1-4}{}^{a/p})_{x/z}$, if present, represent independently selected residues $R^a$ and $R^p$ as defined above.

11. The device of claims 10, in which A is selected from structures of formulae (V-XVI) below

  (VII)

  (VIII)

  (IX)

  (X)

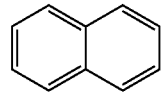  (XI)

  (XII)

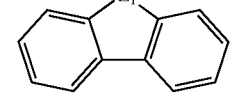  (XIII)

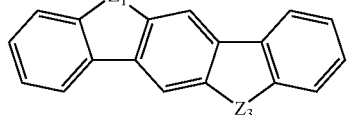  (XIV)

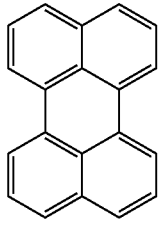  (XV)

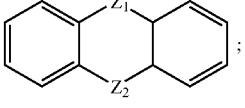  (XVI)

in which each of $Z^1$, $Z^2$ and $Z^3$ is the same or different and is selected from the group consisting of O, S, SO, $SO_2$, $NR^1$, $N^-(R^{1'})(1'')$, $C(R^2)(R^3)$, $Si(R^{2'})(R^{3'})$ and $P(O)(OR^4)$, wherein $R^1$, $R^{1'}$ and $R^{1''}$ are the same or different and each is selected from the group consisting of hydrogen atoms, alkyl groups, haloalkyl groups, alkoxy groups, alkoxyalkyl groups, aryl groups, aryloxy groups, and aralkyl groups, which are substituted with at least one group of formula —$N^+(R^5)_3$ wherein each group $R^5$ is the same or different and is selected from the group consisting of hydrogen atoms, alkyl groups and aryl groups, $R^2$, $R^3$, $R^{2'}$ and $R^{3'}$ are the same or different and each is selected from the group consisting of hydrogen atoms, alkyl groups, haloalkyl groups, alkoxy groups, halogen atoms, nitro groups, cyano groups, alkoxyalkyl groups, aryl groups, aryloxy groups and aralkyl groups or $R^2$ and $R^3$ together with the carbon atom to which they are attached represent a carbonyl group, and $R^4$ is selected from the group consisting of hydrogen atoms, alkyl groups, haloalkyl groups, alkoxyalkyl groups, aryl groups, aryloxy groups and aralkyl groups.

12. The device of claim 10, in which any $R^p$ is selected from vinyl, allyl, ethinyl, independently from any other $R^p$ optionally present on the A to which it is linked or optionally present on a different A within the structures (I) and/or (II).

13. The device of claim 1, in which the liquid organic charge transporting material comprises a structure according to formula (VI)

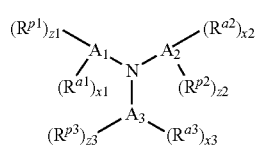

in which $R^{a1}$, $R^{a2}$ and $R^{a3}$ and x1, x2 and x3 are defined, independently, like Ra and x, respectively, in claim 10; $R^{p1}$, $R^{p2}$ and $R^{p3}$ and z1, z2 and z3 are defined, independently, like $R^p$ and z, respectively, in claim 10.

14. The device of claim 1, wherein said device has a photovoltaic conversion efficiency (η) of at least 2% under simulated AM 1.5 solar conditions at 100 mWcm$^{-2}$.

15. A method for preparing a solar cell comprising the steps of:
providing an organic charge transporting composition, said composition comprising an electronically conductive charge transporting material capable of transporting electrons or holes, said material being liquid at a temperature of ≦180° C.;
if necessary, liquefying the composition by heating;
if there is any solvent present in said composition, removing the solvent;
applying the solvent-free, liquid charge transporting composition to the, optionally sensitised, surface of a semiconductor; and,
applying a counter electrode oppositely to said semiconductor.

16. The method of claim 15, wherein the counter-electrode is applied before the step of applying the solvent-free, liquid charge transporting composition, so as to provide a solar cell comprising an inner, air-occupied space.

17. The method of claim 16, further comprising, following the step of applying the liquid charge transporting material: increasing the viscosity of the liquid hole conducting material by gelling, cross-linking and/or polymerising the liquid charge transporting material.

18. The method of claim 15, wherein the solvent-free, liquid charge transporting composition is applied through a hole in an electrode of the solar cell.

19. A charge transporting composition, said composition comprising an electronically conductive organic charge transporting material defined as an organic compound of a specific chemical structure providing a charge transporting amorphous liquid, wherein said organic charge transporting composition is substantially free of any other, chemically different organic charge transporting material, and wherein said organic charge transporting material has a molecular weight of ≦5000 and is liquid at a temperature of ≦100° C.

20. An optoelectronic and/or electrochemical device comprising a charge transporting composition, the composition comprising an organic compound of a specific chemical structure, said compound being electronically conductive and thus capable of transporting electrons or holes and thus constitutes an electronically conductive organic charge transporting material, wherein said composition is substantially free of any other, chemically different organic electronically conductive charge transporting material, wherein said organic charge transporting material has a molecular weight of ≦5000 and is liquid at a temperature of ≦100° C., and wherein the charge transporting composition comprises 70-100 wt. % of said organic charge transporting material.

21. An optoelectronic and/or electrochemical device comprising a charge transporting composition, the composition comprising an organic compound of a specific chemical structure, said compound being electronically conductive and thus capable of transporting electrons or holes and thus constitutes an electronically conductive organic charge transporting material, wherein said composition is substantially free of any other, chemically different organic electronically conductive charge transporting material, wherein said organic charge transporting material has a molecular weight of ≦5000 and is liquid at a temperature of ≦100° C., and wherein the liquid charge transporting composition is substantially solvent-free and/or wherein the charge transporting material is charge-neutral.

* * * * *